US011398448B2

(12) United States Patent
Kato et al.

(10) Patent No.: US 11,398,448 B2
(45) Date of Patent: Jul. 26, 2022

(54) SEMICONDUCTOR MODULE

(71) Applicant: FUJI ELECTRIC CO., LTD., Kawasaki (JP)

(72) Inventors: Ryoichi Kato, Kawasaki (JP); Yuma Murata, Kawasaki (JP); Naoyuki Kanai, Kawasaki (JP); Akito Nakagome, Kawasaki (JP); Yoshinari Ikeda, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/187,668

(22) Filed: Feb. 26, 2021

(65) Prior Publication Data

US 2021/0280550 A1    Sep. 9, 2021

(30) Foreign Application Priority Data

Mar. 6, 2020    (JP) .............................. JP2020-038369

(51) Int. Cl.
*H01L 23/00*    (2006.01)
*H01L 25/07*    (2006.01)
*H01L 23/498*    (2006.01)

(52) U.S. Cl.
CPC ........ *H01L 24/32* (2013.01); *H01L 23/49844* (2013.01); *H01L 24/40* (2013.01); *H01L 24/48* (2013.01); *H01L 25/072* (2013.01); *H01L 2224/32245* (2013.01); *H01L 2224/40137* (2013.01); *H01L 2224/48153* (2013.01)

(58) Field of Classification Search
CPC ..... H01L 24/32; H01L 23/5386; H01L 24/40; H01L 24/48; H01L 25/072; H01L 2224/3205; H01L 2224/48137; H01L 23/49811; H01L 25/18; H01L 24/73; H01L 2224/371; H01L 2224/41113; H01L 24/41; H01L 24/37; H01L 2224/0603; H01L 2224/40095; H01L 2224/40225; H01L 2224/73221; H01L 2924/00014; H01L 2924/181; H02M 7/5387; H02M 7/003
USPC ....................................................... 257/734
See application file for complete search history.

(56) References Cited

U.S. PATENT DOCUMENTS

| 8,637,964 B2 | 1/2014 | Jones et al. |
| 9,991,609 B2 | 6/2018 | Hoehn et al. |
| 2012/0236500 A1 | 9/2012 | Higuchi et al. |
| 2019/0139880 A1 | 5/2019 | Jakobi et al. |

FOREIGN PATENT DOCUMENTS

| JP | 2010073704 A | 4/2010 |
| JP | 2014236179 A | 12/2014 |
| WO | 2010147199 A1 | 12/2010 |

*Primary Examiner* — Elias Ullah
(74) *Attorney, Agent, or Firm* — Rabin & Berdo, P.C.

(57) ABSTRACT

A semiconductor module includes first to fourth semiconductor elements, each having an upper-surface electrode and a lower-surface electrode, first to fourth conductive layers, each extending in a first direction and being independently disposed side by side in a second direction orthogonal to the first direction, and an output terminal connected to the second and third conductive layers. The lower-surface electrodes of each of the first to fourth semiconductor elements are respectively conductively connected to the first to fourth conductive layers. The third conductive layer and the fourth conductive layer are disposed between the first conductive layer and the second conductive layer and are connected to the output terminal to have an equal potential.

8 Claims, 5 Drawing Sheets

SEMICONDUCTOR MODULE

CROSS REFERENCE TO RELATED APPLICATIONS

This application is based upon and claims the benefit of priority of the prior Japanese Patent Application No. 2020-038369, filed on Mar. 6, 2020, the entire contents of which are incorporated herein by reference.

BACKGROUND OF THE INVENTION

Field of the Invention

The present invention relates to a semiconductor module.

Description of the Related Art

A semiconductor device has a substrate having thereon semiconductor elements such as an insulated gate bipolar transistor (IGBT), a power metal oxide semiconductor field effect transistor (MOSFET), or freewheeling diode (FWD) and is used in an inverter apparatus or the like (see U.S. Pat. No. 9,991,609, Japanese Patent Laid-Open No. 2014-236179, International Publication No. WO 2010/147199, Japanese Patent Laid-Open No. 2010-073704, U.S. Pat. No. 8,637,964, and U.S. Patent Application Publication No. 2019/0139880, for example).

U.S. Pat. No. 9,991,609 discloses arranging a P terminal and an N terminal to be parallel flat-plate-like shapes and with each of the terminals having two branching ends. Japanese Patent Laid-Open No. 2014-236179 discloses a semiconductor module having a wiring pattern divided by grooves into a plurality of sections to reduce an increase in electric resistance or inductance of a wiring caused by a skin effect. International Publication No. WO 2010/147199 discloses that, instead of a conductor plate of a wiring substrate, a plurality of conductor lines are bundled into a plate-like shape. Japanese Patent Laid-Open No. 2010-073704 discloses a plurality of wiring conductors on an output side each having a bottom surface part and a side wall part, wherein the side wall parts of adjoining wiring conductors on the output side are arranged closely to each other and substantially in parallel with each other. U.S. Pat. No. 8,637,964 and U.S. Patent Application Publication No. 2019/0139880 disclose that a wiring pattern is provided in which semiconductor chips of an upper arm and a lower arm, which are connected in parallel, are mounted.

In order to operate an alternating-current motor from a vehicle-mounted direct-current battery, components of a power module require a P terminal and an N terminal that lead current from the direct-current battery, and output terminals (U, V, W) that lead current converted from direct current to alternating current to the motor. Also, for the conversion from direct current to alternating current, three phases of so-called "2-in-1 configurations" are required. According to a configuration of prior art, the flow of current for each phase is from one P terminal toward one N terminal. As a method for connecting the PN terminals and output terminals, screw clamping is adopted because of easier connectivity.

The wiring inductance value between the PN terminals affects a switching loss. For example, as the inductance value decreases, di/dt upon switching can be increased, which can reduce the switching loss.

However, such a structure cannot be realized under the present circumstances, and the inductance value between the PN terminals is high. Therefore, the switching loss cannot be sufficiently reduced. With increased outputs and increased frequencies of power modules, heating of the terminals becomes problematic.

The present invention has been made in view of these points, and it is one of objects of the present invention to provide a semiconductor module that can reduce inductance between PN terminals and distribute heating of the terminals.

SUMMARY OF THE INVENTION

A semiconductor module according to one aspect of the present invention includes a first semiconductor element, a second semiconductor element, a third semiconductor element, and a fourth semiconductor element each having an upper-surface electrode and a lower-surface electrode, a first conductive layer, a second conductive layer, a third conductive layer, and a fourth conductive layer extending in a predetermined direction and independently disposed side by side in a direction crossing the predetermined direction, and a case terminal connected to the second conductive layer and the third conductive layer. The lower-surface electrode of the first semiconductor element is conductively connected to the first conductive layer, the lower-surface electrode of the second semiconductor element is conductively connected to the second conductive layer, the lower-surface electrode of the third semiconductor element is conductively connected to the third conductive layer, the lower-surface electrode of the fourth semiconductor element is conductively connected to the fourth conductive layer, and the third conductive layer and the fourth conductive layer are disposed between the first conductive layer and the second conductive layer and are connected to the case terminal to have an equal potential.

Advantageous Effects of Invention

According to the present invention, inductance between PN terminals can be reduced, and heating of the terminals can be distributed.

DETAILED DESCRIPTION OF THE PREFERRED EMBODIMENT

Figure 1:
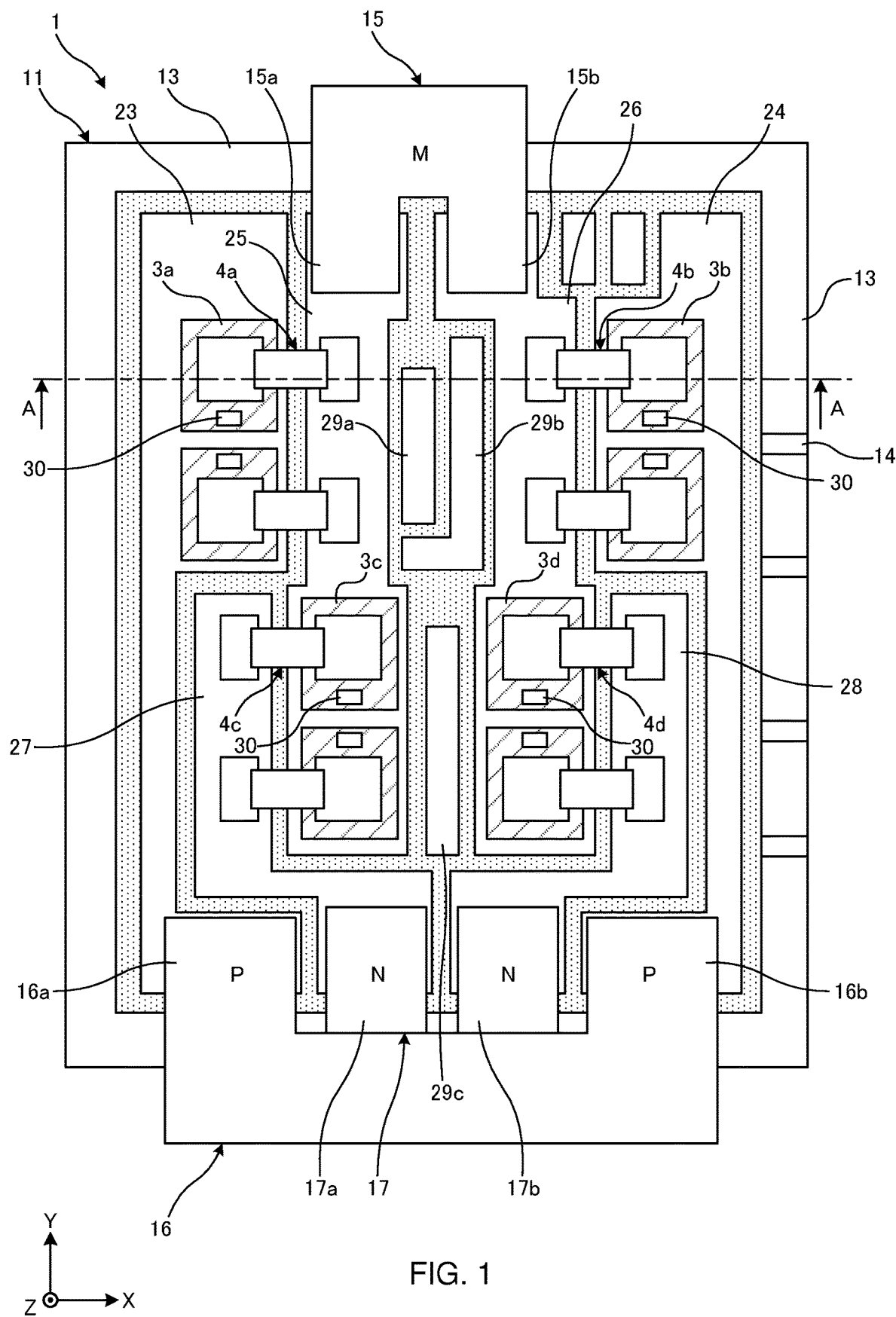
FIG. 1 is a plan view of a semiconductor device according to an embodiment.
Figure 2:
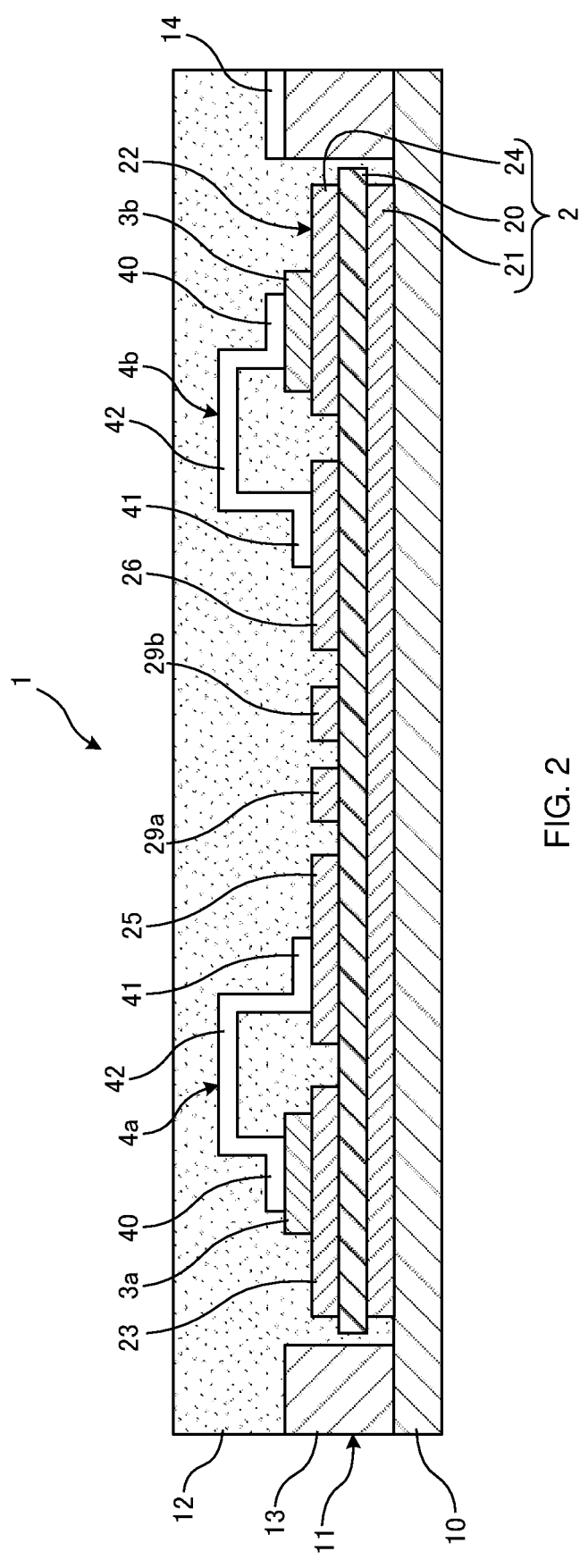
FIG. 2 is a cross-sectional view taken along Line A-A of the semiconductor device shown in FIG. 1.
Figure 3:
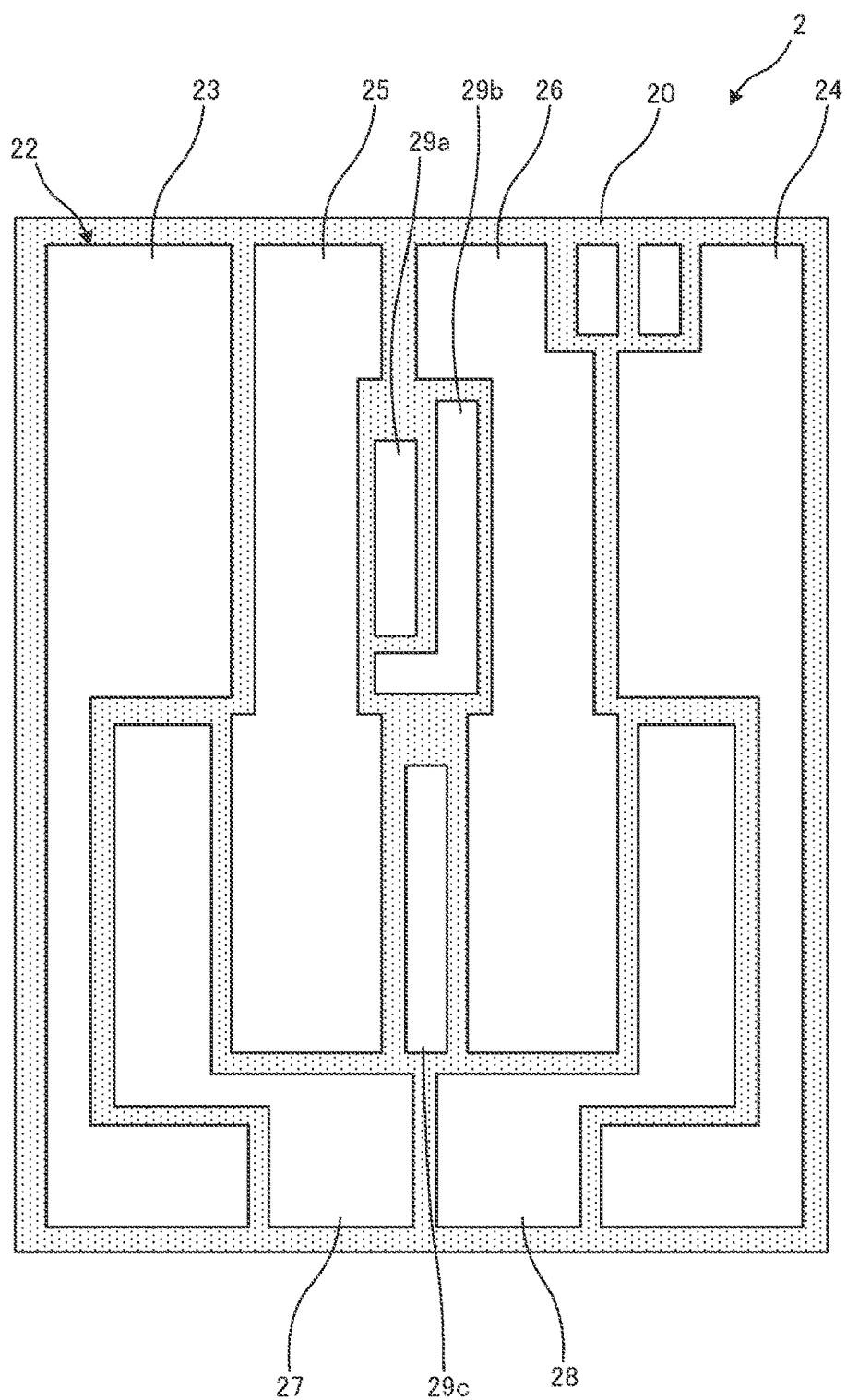
FIG. 3 is a plan view showing a layout of a circuit board according to the embodiment.
Figure 4:
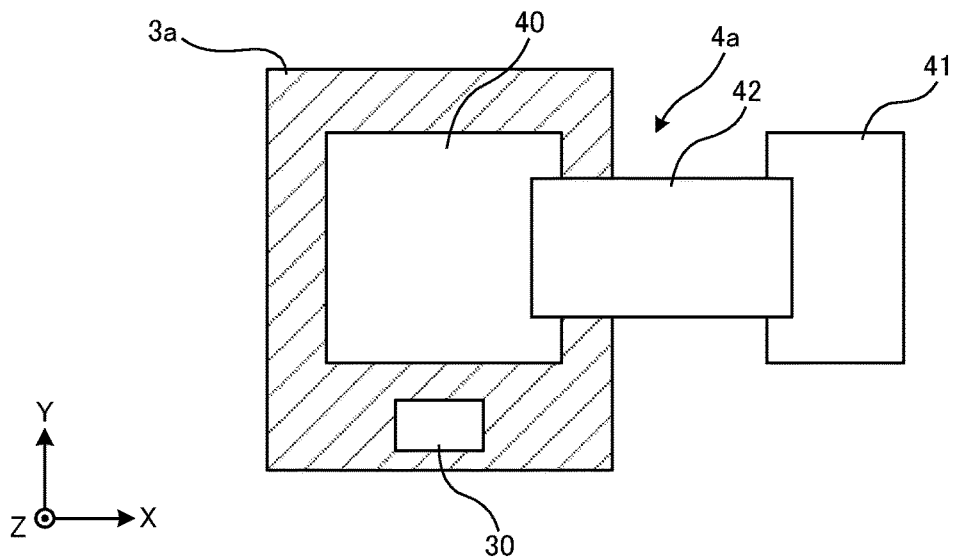
FIG. 4 is a plan view of a semiconductor element according to the embodiment.
Figure 5:
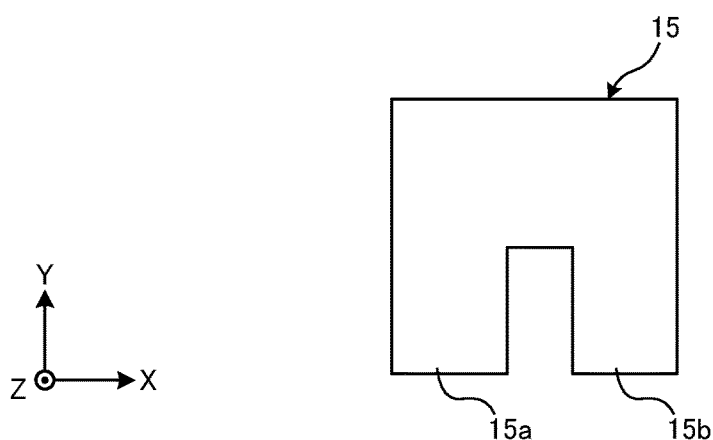
FIG. 5 is a plan view of an output terminal according to the embodiment.
Figure 6:
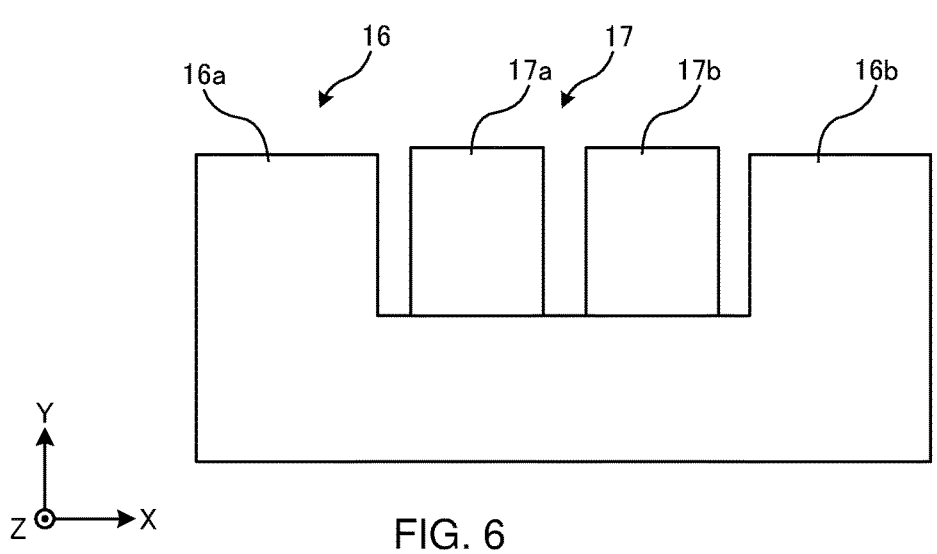
FIG. 6 is a plan view of a P terminal and an N terminal according to the embodiment.

A semiconductor module to which the present invention is applicable is described below. FIG. 1 is a plan view of a semiconductor device according to an embodiment. FIG. 2 is a cross-sectional view taken along Line A-A of the semiconductor device shown in FIG. 1. FIG. 3 is a plan view showing a layout of a circuit board according to the embodiment. FIG. 4 is a plan view of a semiconductor element according to the embodiment. FIG. 5 is a plan view of an output terminal according to the embodiment. FIG. 6 is a plan view of a P terminal and an N terminal according to the embodiment. Note that the semiconductor module described below is merely an example and, without limiting thereto, can be changed as required.

In the following drawings, the direction in which a plurality of semiconductor modules are arranged, the direction in which an upper arm and a lower arm, which are connected in series, are arranged, and the direction of height are defined as an X-direction, a Y-direction, and a Z-direction, respectively. The shown X, Y, and Z axes are orthogonal to each other and form a right-handed system. In some cases, the X, Y and Z-directions may be referred to as a right-left direction, a front-back direction, and a top-bottom direction, respectively. These directions (right-left, front-back and top-bottom directions) are words used for convenience of description, and, depending on the orientation of the attachment of the semiconductor device, the correspondence relationships with the XYZ directions may be changed. For example, the heat radiating surface side (cooler side) of the semiconductor device is referred to as a "lower surface side", and the opposite side is referred to as an "upper surface side". Planar view herein means that the upper surface of the semiconductor device is viewed from the Z-direction positive side.

The semiconductor device according to this embodiment is applied to a power conversion device in a power module, for example, and is a power module included in an inverter circuit. The semiconductor device includes a semiconductor module 1. With reference to FIG. 1, a single semiconductor module 1 is described. For example, in a case where the semiconductor device is included in a three-phase inverter circuit, three semiconductor modules in FIG. 1 are disposed side by side in the X-direction in order of a U phase, a V phase and a W phase.

As shown in FIGS. 1 to 6, the semiconductor module 1 includes a base plate 10, a laminate substrate 2 disposed on the base plate 10, a plurality of semiconductor elements disposed on the laminate substrate 2, a case member 11 that accommodates the laminate substrate 2 and the semiconductor elements, and a sealing resin 12 filled within the case member 11.

The base plate 10 is an oblong plate having an upper surface and a lower surface. The base plate 10 functions as a heatsink. The base plate 10 has a rectangular shape in planar view elongated in the X-direction. The base plate 10 is a metallic plate of, for example, copper, aluminum or an alloy thereof and the surface may be subjected to plating treatment.

The case member 11 that is rectangular in planar view and has a frame shape is disposed on the upper surface of the base plate 10. The case member 11 is molded with, for example, a synthetic resin and is jointed to the upper surface of the base plate 10 through an adhesive (not shown). Control terminals 14 for external connection are provided in one side wall part 13 of the case member 11. For example, the control terminals 14 are integrally embedded in a side wall part 13 on an X-direction positive side of a pair of side wall parts facing each other in the X-direction of the case member 11.

The control terminals 14 are formed by bending a plate-like body of a metallic material such as a copper material, a copper-alloy-based material, an aluminum-alloy-based material or an iron-alloy-based material. A part of the control terminals 14 is exposed on the upper surface of the side wall part 13. On a pair of side wall parts 13 facing each other in the Y-direction of the case member 11, an output terminal 15 (M terminal) as a case terminal is provided on the Y-direction positive side, and a positive electrode terminal 16 (P terminal) and a negative electrode terminal 17 (N terminal) as case terminals are provided on the Y-direction negative side, the details of which are described below.

Inside of the case member 11, the laminate substrate 2 is disposed on the upper surface of the base plate 10. The laminate substrate 2 is formed by stacking a metallic layer and an insulating layer and is configured by, for example, a direct copper bonding (DCB) substrate, an active metal brazing (AMB) substrate or a metallic base substrate. More specifically, the laminate substrate 2 has an insulating plate 20, a heatsink 21 disposed on a lower surface of the insulating plate 20, and a plurality of circuit boards 22 disposed on an upper surface of the insulating plate 20. The laminate substrate 2 is formed to be, for example, a rectangular shape in planar view.

The insulating plate 20 is formed to have a predetermined thickness in the Z-direction and to be a flat-shaped plate having an upper surface and a lower surface. The insulating plate 20 is formed from an insulating material such as a ceramics material such as alumina ($Al_2O_3$), aluminum nitride (AlN), or silicon nitride ($Si_3N_4$), a resin material such as epoxy, or an epoxy resin material using a ceramics material as a filler. The insulating plate 20 may also be referred to as an insulating layer or an insulating film.

The heatsink 21 is formed to have a predetermined thickness in the Z-direction and to cover the entire lower surface of the insulating plate 20. The heatsink 21 is formed by a metallic plate having a good thermal conductivity of, for example, copper or aluminum.

On the upper surface (main surface) of the insulating plate 20, the plurality of circuit boards 22 are formed to have independent island shapes where the circuit boards 22 are electrically insulated from each other. Each of the plurality of circuit boards 22 is configured by a metallic layer formed of, for example, copper foil and having a predetermined thickness. More specifically, the plurality of circuit boards 22 are configured to include first to sixth conductive layers 23 to 28 extending in the Y-direction (predetermined direction). The first to sixth conductive layers 23 to 28 are disposed side by side in the X-direction (direction crossing the Y-direction). In particular, the plurality of circuit boards 22 are arranged in order of the first conductive layer 23, the fifth conductive layer 27, the third conductive layer 25, the fourth conductive layer 26, the sixth conductive layer 28, and the second conductive layer 24 from the X-direction negative side.

An end on the Y-direction negative side of the first conductive layer 23 is positioned on the Y-direction negative side more than an end on the Y-direction negative side of the third conductive layer 25. An end on the Y-direction negative side of the second conductive layer 24 is positioned on the Y-direction negative side more than an end on the Y-direction negative side of the fourth conductive layer 26.

The third conductive layer 25 and the fourth conductive layer 26 are disposed between the first conductive layer 23 and the second conductive layer 24. The fifth conductive layer 27 is disposed between the first conductive layer 23 and the third conductive layer 25. The sixth conductive layer 28 is disposed between the second conductive layer 24 and the fourth conductive layer 26.

The Y-direction negative side of the fifth conductive layer 27 is bent to a crank shape, and the end of the fifth conductive layer 27 is positioned on the X-direction positive side more than the first conductive layer 23 and on the Y-direction negative side more than the third conductive layer 25. The Y-direction negative side of the sixth conductive layer 28 is bent to a crank shape, and the end of the sixth conductive layer 28 is positioned on the X-direction negative side more than the second conductive layer 24 and on the Y-direction negative side more than the fourth conductive layer 26. In this way, the first conductive layer 23, the third conductive layer 25 and the fifth conductive layer 27, and the second conductive layer 24, the fourth conductive layer 26 and the sixth conductive layer 28 are disposed in a mirror image arrangement with respect to the X-direction center of the insulating plate 20.

Ends (another end side) on the Y-direction negative side of the first conductive layer 23 and the second conductive layer 24 are connected to the positive electrode terminal 16, the details of which are described below. Ends (one end side) on the Y-direction positive side of the third conductive layer 25 and the fourth conductive layer 26 are connected to the output terminal 15. Furthermore, ends (another end side) on the Y-direction negative side of the fifth conductive layer 27 and the sixth conductive layer 28 are connected to the negative electrode terminal 17.

Relatively narrower control circuit boards 29a to 29c extending in the Y-direction are disposed between the third conductive layer 25 and the fourth conductive layer 26. The control circuit boards 29a and 29b are disposed side by side in the X-direction on the Y-direction positive side, and the control circuit board 29c is disposed on the Y-direction negative side. A wire for control (not shown) is connected to these control circuit boards 29a to 29c.

A plurality of semiconductor elements 3 are disposed at predetermined positions on the upper surfaces of the circuit boards 22 through a jointing material (not shown) such as soldering. Each of the semiconductor elements is formed to have a square shape in planar view by a semiconductor substrate of, for example, silicon (Si), silicon carbide (SiC), or gallium nitride (GaN). According to this embodiment, each of the semiconductor elements is configured by a reverse conducting (RC)-IGBT element integrally having functions of an insulated gate bipolar transistor (IGBT) element and a freewheeling diode (FWD) element.

Without limiting thereto, each of the semiconductor elements may be configured by a combination of a switching element such as an IGBT, a power metal oxide semiconductor field effect transistor (MOSFET) or a bipolar junction transistor (BJT) and a diode such as a freewheeling diode (FWD). Alternatively, for example, a reverse blocking (RB)-IGBT having sufficient resistance to pressure against reverse bias may be used as the semiconductor elements. The shape, arranged number and arranged positions of the semiconductor elements may be changed as required.

According to this embodiment, eight semiconductor elements are disposed for one phase. More specifically, according to this embodiment, two first semiconductor elements 3a, two second semiconductor elements 3b, two third semiconductor elements 3c, and two fourth semiconductor elements 3d are disposed side by side in the Y-direction. Each of the semiconductor elements has an upper-surface electrode (which may be referred to as an emitter electrode or a source electrode) and a lower-surface electrode (which may be referred to as a collector electrode or a drain electrode). Each of the semiconductor elements further has a gate electrode 30 (see FIG. 4) disposed at a deviated position on the outer periphery side of the upper surface. The gate electrodes 30 in each pair of the two first semiconductor elements 3a, two second semiconductor elements 3b, two third semiconductor elements 3c, and two fourth semiconductor elements 3d face each other in the Y-direction.

The first semiconductor elements 3a are disposed on the upper surface of the first conductive layer 23. In other words, the lower-surface electrodes of the first semiconductor elements 3a are conductively connected to the first conductive layer 23. The two first semiconductor elements 3a are disposed at positions deviated to the Y-direction positive side of the first conductive layer 23 and are connected in parallel.

The second semiconductor elements 3b are disposed on the upper surface of the second conductive layer 24. In other words, the lower-surface electrodes of the second semiconductor elements 3b are conductively connected to the second conductive layer 24. The two second semiconductor elements 3b are disposed at positions deviated to the Y-direction positive side of the second conductive layer 24 and are connected in parallel.

The third semiconductor elements 3c are disposed on the upper surface of the third conductive layer 25. In other words, the lower-surface electrodes of the third semiconductor elements 3c are conductively connected to the third conductive layer 25. The two third semiconductor elements 3c are disposed at positions deviated to the Y-direction negative side of the third conductive layer 25 and are connected in parallel.

The fourth semiconductor elements 3d are disposed on the upper surface of the fourth conductive layer 26. In other words, the lower-surface electrodes of the fourth semiconductor elements 3d are conductively connected to the fourth conductive layer 26. The two fourth semiconductor elements 3d are disposed at positions deviated to the Y-direction negative side of the fourth conductive layer 26 and are connected in parallel.

The first semiconductor elements 3a and the second semiconductor elements 3b configure an upper arm, and the third semiconductor elements 3c and the fourth semiconductor elements 3d configure a lower arm. The upper arm and the lower arm are connected in series. As shown in FIG. 1, the first semiconductor elements 3a and the second semiconductor elements 3b are disposed at positions deviated to the side having the output terminal 15, which is described below, and the third semiconductor elements 3c and the fourth semiconductor elements 3d are disposed at positions deviated to the side having the negative electrode terminal 17.

The first semiconductor elements 3a and the third semiconductor elements 3c, and the second semiconductor elements 3b and the fourth semiconductor elements 3d are disposed in a mirror image arrangement with respect to the X-direction center of the laminate substrate 2. The first semiconductor elements 3a and the second semiconductor elements 3b included in the upper arm are disposed away from the X-direction center of the laminate substrate 2 while the third semiconductor elements 3c and the fourth semiconductor elements 3d included in the lower arm are disposed closely to the X-direction center of the laminate substrate 2.

The upper-surface electrodes of the semiconductor elements and the predetermined circuit boards 22 are electrically connected via metallic wiring boards (first to fourth wires 4a to 4d) as a main current wiring member. The first wire 4a connects the upper-surface electrode of the first semiconductor element 3a and the third conductive layer 25. The second wire 4b connects the upper-surface electrode of the second semiconductor element 3b and the fourth conductive layer 26. The third wire 4c connects the upper-surface electrode of the third semiconductor element 3c and the fifth conductive layer 27. The fourth wire 4d connects the upper-surface electrode of the fourth semiconductor element 3d and the sixth conductive layer 28.

Each of the metallic wiring boards is formed by bending, through, for example, press processing, a metallic material such as a copper material, a copper-alloy-based material, an aluminum-alloy-based material or an iron-alloy-based material. Because all of the metallic wiring boards have the same configuration, a common reference is given for description. More specifically, as shown in FIG. 4, the metallic wiring board includes a first junction part 40 to be jointed with the upper-surface electrode of the predetermined semiconductor element, a second junction part 41 to be jointed with the predetermined circuit board 22, and a connection part 42 that connects the first junction part 40 and the second junction part 41. The shape of the metallic wiring board shown in FIG. 4 is merely an example and can be changed as required. Each of the metallic wiring boards may be referred to as a lead frame. The metallic wiring boards (first to fourth wires 4a to 4d) extend in the X-direction in the planar view shown in FIG. 1.

In the case member 11, the output terminal 15, the positive electrode terminal 16, and the negative electrode terminal 17 are provided as case terminals for external connection of the main current as described above. The output terminal 15 is disposed on the Y-direction positive side of the pair of side wall parts 13 facing each other in the Y-direction of the case member 11. The positive electrode terminal 16 and the negative electrode terminal 17 are disposed on the Y-direction negative side of the pair of side wall parts 13 facing each other in the Y-direction of the case member 11.

Each of those case terminals are formed by, for example, press processing, for example, a metallic material such as a copper material, a copper-alloy-based material, an aluminum-alloy-based material or an iron-alloy-based material. As shown in FIG. 1 and FIG. 5, the output terminal 15 has two branching output ends 15a and 15b. The output ends 15a and 15b are disposed side by side in the X-direction. The output end 15a positioned on the X-direction negative side is connected to the end (one end side) on the Y-direction positive side of the third conductive layer 25. The output end 15b positioned on the X-direction positive side is connected to the end (one end side) on the Y-direction positive side of the fourth conductive layer 26. The third conductive layer 25 and the fourth conductive layer 26 are connected to the output terminal 15 to have an equal potential, the details of which are described below.

As shown in FIG. 1 and FIG. 6, the positive electrode terminal 16 has two branching positive electrode ends 16a and 16b. The positive electrode ends 16a and 16b are disposed side by side in the X-direction with a predetermined interval therebetween. The negative electrode terminal 17 is provided between the positive electrode ends 16a and 16b. The positive electrode end 16a positioned on the X-direction negative side is connected to the end (another end side) on the Y-direction negative side of the first conductive layer 23. The positive electrode end 16b positioned on the X-direction positive side is connected to the end (another end side) on the Y-direction negative side of the second conductive layer 24.

As shown in FIG. 1 and FIG. 6, the negative electrode terminal 17 has two branching negative electrode ends 17a and 17b. The negative electrode ends 17a and 17b are disposed side by side in the X-direction between the positive electrode ends 16a and 16b. The negative electrode end 17a positioned on the X-direction negative side is connected to the end (another end side) on the Y-direction negative side of the fifth conductive layer 27. The negative electrode end 17b positioned on the X-direction positive side is connected to the end (another end side) on the Y-direction negative side of the sixth conductive layer 28.

Since the inductance between PN terminals affects a switching loss in a semiconductor module, reduction of the inductance has been demanded. With the recent innovation of technologies, when a next-generation device (which may also be referred to as a wideband gap semiconductor) of SiC, GaN, or the like is adopted, adoption of a higher switching frequency (such as 20 to 100 kHz) is predicted. In this case, there is a problem that current concentrates on ends of circuit boards on an insulating substrate due to a skin effect of the current so that the ends are abnormally heated. This has not been problematic with the conventional relatively low frequencies (10 kHz or lower). Note that the skin effect is a phenomenon in which current flows disproportionately in ends of a conductive layer.

Figure 7:
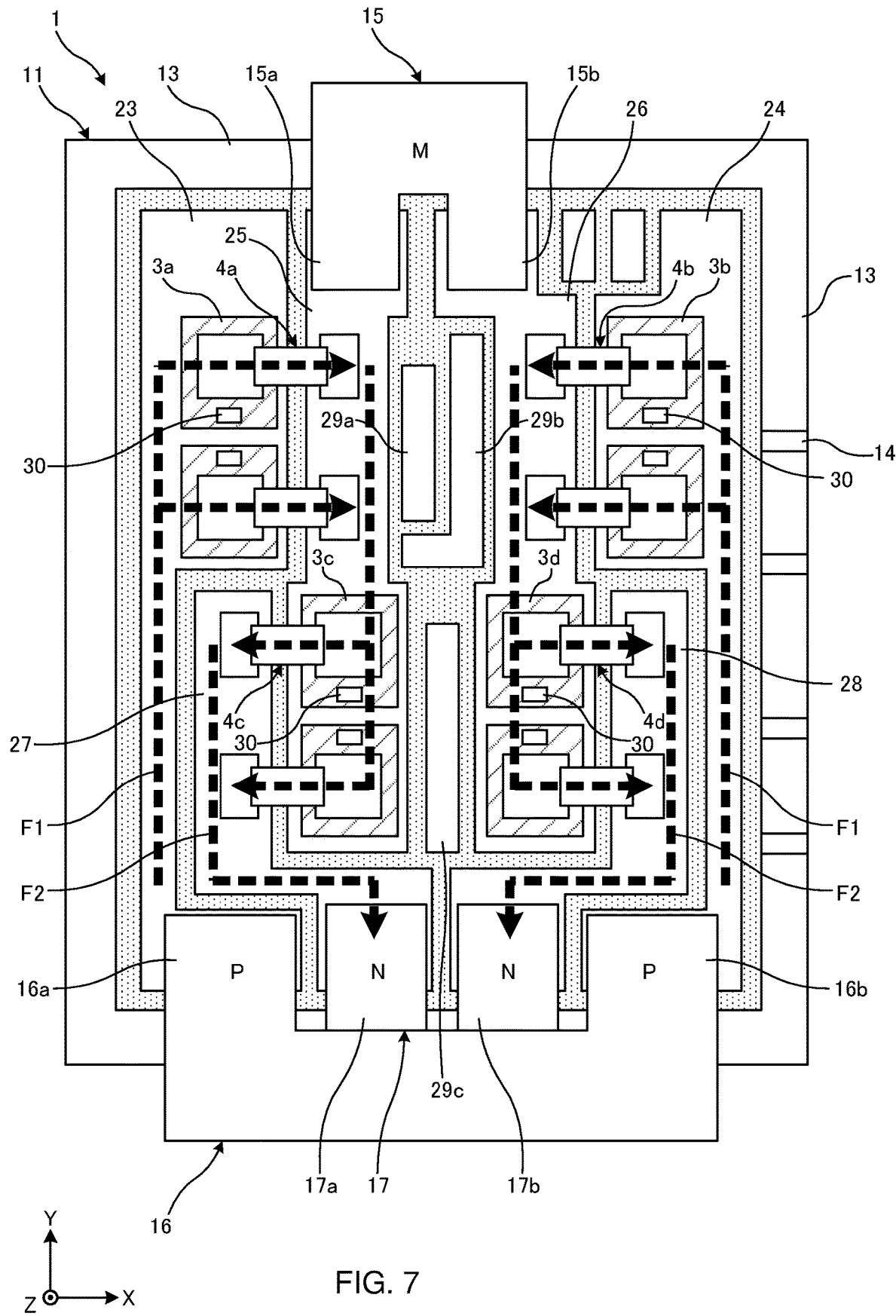
FIG. 7 is a schematic view showing flows of current in a semiconductor module according to the embodiment.

Accordingly, the present inventors have focused on the layout of the circuit boards, semiconductor elements and case terminals on an insulating substrate and have reached the present invention. FIG. 7 is a schematic view showing flows of current in a semiconductor module according to the embodiment. More specifically, according to this embodiment, as shown in FIG. 7, a plurality of circuit boards on which semiconductor elements are disposed are extended in a predetermined direction, and the plurality circuit boards are disposed side by side in the direction crossing the predetermined direction. Predetermined circuit boards (the third conductive layer 25 and the fourth conductive layer 26) positioned on the inner side of among the plurality of circuit boards are connected to the output terminal 15 as a case terminal to have an equal potential.

More specifically, the output terminal 15 is provided at the end on the Y-direction positive side and has two branching output ends 15a and 15b. One output end 15a is connected to one end side of the third conductive layer 25, and the other output end 15b is connected to one end side of the fourth conductive layer 26.

The positive electrode terminal 16 having the two branching positive electrode ends 16a and 16b is provided at the end on the Y-direction negative side. One positive electrode end 16a is connected to the other end side of the first conductive layer 23, and the other positive electrode end 16b is connected to the other end side of the second conductive layer 24. In other words, the first semiconductor elements 3a and the second semiconductor elements 3b configure the upper arm.

Also, the negative electrode terminal 17 having the two branching negative electrode ends 17a and 17b is provided at the end on the Y-direction negative side. Furthermore, the fifth conductive layer 27 is disposed between the first conductive layer 23 and the third conductive layer 25, and the sixth conductive layer 28 is disposed between the second conductive layer 24 and the fourth conductive layer 26. One negative electrode end 17a is connected to the other end side of the fifth conductive layer 27, and the other negative electrode end 17b is connected to the other end side of the sixth conductive layer 28. In other words, the third semiconductor elements 3c and the fourth semiconductor elements 3d configure the lower arm.

In this way, according to this embodiment, in order to reduce the PN inductance, (1) the number of parallel columns through which the main current flows is increased from conventional one to two; and (2) a wiring pattern (circuit board layout) is adopted in which the current paths between the P terminal and the N terminal are parallel with each other such that the length of the current paths can be reduced as much as possible.

As shown in FIG. 7, in the semiconductor module 1, the main current flowing from the positive electrode terminal 16 is divided into two by the positive electrode ends 16a and 16b on both outer sides. The main current flows from the first conductive layer 23 (second conductive layer 24) through the first semiconductor elements 3a (second semiconductor elements 3b) in the upper arm to the third conductive layer 25 (fourth conductive layer 26). The main current further flows through the third semiconductor elements 3c (fourth semiconductor elements 3d) in the lower arm, to flow from the fifth conductive layer 27 (sixth conductive layer 28) into the negative electrode end 17a (negative electrode end 17b).

In this way, according to this embodiment, the layout of the circuit boards which are current paths is configured from a plurality of straight lines so that a plurality of distributed current paths are formed. As a result, the current flowing through the ends due to the skin effect is distributed in one circuit board, and excessive heating at the ends of the circuit board can be prevented. As shown in FIG. 7, a current path F1 in the upper arm and a current path F2 in the lower arm are parallel and adjacent to each other, and the main currents flow in the opposite directions to each other. Therefore, because of the effect of the mutual inductance, reduction of the inductance can be realized, and the switching loss is reduced. Since a configuration is adopted in which each of the case terminals has a plurality of branching ends, the degree of adhesion between the other members can be improved when sealed with a resin, and the members cannot be easily peeled off. The entire layout is disposed in a mirror image arrangement as described above so that, even though the current path is divided into two, deviation of the currents does not easily occur, and local heating can be suppressed.

According to this embodiment, as described above, the inductance between the PN terminals can be reduced.

In the embodiment above, the number and arranged positions of the semiconductor elements are not limited to the configuration above but can be changed as required.

In the embodiment above, the number and layout of the circuit boards are not limited to the configuration above but can be changed as required.

Although the laminate substrate 2 and the semiconductor elements are formed to be in a rectangular shape or square shape in planar view according to the embodiment above, the present invention is not limited to the configuration. The laminate substrate 2 and the semiconductor elements may be formed to have a polygonal shape other than those described above.

Having described the embodiment and the variation examples, the above embodiment and the variation examples may be wholly or partially combined as another embodiment.

The embodiments are not limited to the above-described embodiment and variation examples, and various changes, replacements and modifications may be made thereto without departing from the spirit and scope of the technical idea. If the technical idea can be implemented in another manner based on a technological advancement or another technology derived therefrom, the technical idea may be carried out by such method. Therefore, the claims cover all embodiments that can be included within the scope of the technical idea.

Feature points of the above-described embodiment are organized below.

A semiconductor module according to the embodiment includes a first semiconductor element, a second semiconductor element, a third semiconductor element, and a fourth semiconductor element each having an upper-surface electrode and a lower-surface electrode, a first conductive layer, a second conductive layer, a third conductive layer, and a fourth conductive layer extending in a predetermined direction and independently disposed side by side in a direction crossing the predetermined direction, and a case terminal connected to the second conductive layer and the third conductive layer. The lower-surface electrode of the first semiconductor element is conductively connected to the first conductive layer, the lower-surface electrode of the second semiconductor element is conductively connected to the second conductive layer, the lower-surface electrode of the third semiconductor element is conductively connected to the third conductive layer, the lower-surface electrode of the fourth semiconductor element is conductively connected to the fourth conductive layer, and the third conductive layer and the fourth conductive layer are disposed between the first conductive layer and the second conductive layer and are connected to the case terminal to have an equal potential.

In the semiconductor module described above, the case terminal includes an output terminal having at least two branching output ends, one of the output ends is connected to one end side of the third conductive layer, and another one of the output ends is connected to one end side of the fourth conductive layer.

The semiconductor module described above further includes a positive electrode terminal having at least two branching positive electrode ends. The first semiconductor element and the second semiconductor element configure an upper arm, one of the positive electrode ends is connected to another end side of the first conductive layer, and another one of the positive electrode ends is connected to another end side of the second conductive layer.

The semiconductor module described above further includes a negative electrode terminal having at least two branching negative electrode ends, a fifth conductive layer extending in the predetermined direction and disposed between the first conductive layer and the third conductive layer, and a sixth conductive layer extending in the predetermined direction and disposed between the second conductive layer and the fourth conductive layer. The third semiconductor element and the fourth semiconductor element configure a lower arm, one of the negative electrode ends is connected to another end side of the fifth conductive layer, another one of the negative electrode ends is connected to another end side of the sixth conductive layer, and the one and the other negative electrode ends are disposed between the one and the other positive electrode ends.

In the semiconductor module described above, the first semiconductor element and the second semiconductor element are disposed at positions deviated to a side having the output terminal, and the third semiconductor element and the fourth semiconductor element are disposed at positions deviated to a side having the negative electrode terminal.

The semiconductor module described above further includes a first wire connecting the upper-surface electrode of the first semiconductor element and the third conductive layer, a second wire connecting the upper-surface electrode of the second semiconductor element and the fourth conductive layer, a third wire connecting the upper-surface electrode of the third semiconductor element and the fifth conductive layer, and a fourth wire connecting the upper-surface electrode of the fourth semiconductor element and the sixth conductive layer. The first wire, the second wire, the third wire, and the fourth wire extend in a direction crossing the predetermined direction.

In the semiconductor module described above, a plurality of the first semiconductor elements, a plurality of the second semiconductor elements, a plurality of the third semiconductor elements and a plurality of the fourth semiconductor elements are disposed side by side in the predetermined direction.

In the semiconductor module described above, the first semiconductor element, the third semiconductor element, the first conductive layer, the third conductive layer and the fifth conductive layer, and the second semiconductor element, the fourth semiconductor element, the second conductive layer, the fourth conductive layer and the sixth conductive layer are disposed in a mirror image arrangement.

INDUSTRIAL APPLICABILITY

As described above, the present invention has an effect that the inductance between the PN terminals can be reduced and that heating of the terminals can be distributed and is particularly advantageous in a semiconductor module.

REFERENCE SIGNS LIST

1: semiconductor module
2: laminate substrate
3a: first semiconductor element
3b: second semiconductor element
3c: third semiconductor element
3d: fourth semiconductor element
4a: first wire
4b: second wire
4c: third wire
4d: fourth wire
10: base plate
11: case member
12: sealing resin
13: side wall part
14: control terminal
15: output terminal
15a: output end
15b: output end
16: positive electrode terminal
16a: positive electrode end
16b: positive electrode end
17: negative electrode terminal
17a: negative electrode end
17b: negative electrode end
20: insulating plate
21: heatsink
22: circuit board
23: first conductive layer
24: second conductive layer
25: third conductive layer
26: fourth conductive layer
27: fifth conductive layer
28: sixth conductive layer
29a: control circuit board
29b: control circuit board
29c: control circuit board
30: gate electrode
40: first junction part
41: second junction part
42: connection part
F1: current path
F2: current path

What is claimed is:

1. A semiconductor module, comprising:
a first semiconductor element, a second semiconductor element, a third semiconductor element, and a fourth semiconductor element, each having an upper surface and a lower surface opposite to each other, and having an upper-surface electrode on the upper surface thereof and a lower-surface electrode on the lower surface thereof;
a first conductive layer, a second conductive layer, a third conductive layer, and a fourth conductive layer, each extending in a first direction and independently disposed side by side in a second direction orthogonal to the first direction; and
a case terminal disposed at a first side of the semiconductor module, and being connected to the second conductive layer and the third conductive layer, wherein
the lower-surface electrode of the first semiconductor element is conductively connected to the first conductive layer,
the lower-surface electrode of the second semiconductor element is conductively connected to the second conductive layer,
the lower-surface electrode of the third semiconductor element is conductively connected to the third conductive layer,
the lower-surface electrode of the fourth semiconductor element is conductively connected to the fourth conductive layer, and
the third conductive layer and the fourth conductive layer are disposed between the first conductive layer and the second conductive layer and are connected to the case terminal to have an equal potential.

2. The semiconductor module according to claim 1, wherein
the case terminal includes an output terminal having a body part and at least two output ends branched from the body part,
one of the output ends is connected to one end portion of the third conductive layer, and
another one of the output ends is connected to one end portion of the fourth conductive layer.

3. The semiconductor module according to claim 2, further comprising a positive electrode terminal disposed at a second side of the semiconductor module opposite to the first side in the first direction, and having a body part and at least two positive electrode ends branched from the body part, wherein
the first semiconductor element and the second semiconductor element configure an upper arm,
one of the positive electrode ends is connected to one end portion of the first conductive layer, the one end portion of the first conductive layer being located closer to the second side than to the first side, and
another one of the positive electrode ends is connected to one end portion of the second conductive layer, the one end portion of the second conductive layer being located closer to the second side than to the first side.

4. The semiconductor module according to claim 3, further comprising:
- a negative electrode terminal disposed at the second side of the semiconductor module, and having a body part and at least two negative electrode ends branched from the body part;
- a fifth conductive layer extending in the first direction and disposed between the first conductive layer and the third conductive layer; and
- a sixth conductive layer extending in the first direction and disposed between the second conductive layer and the fourth conductive layer, wherein
- the third semiconductor element and the fourth semiconductor element configure a lower arm,
- one of the negative electrode ends is connected to one end portion of the fifth conductive layer, the one end portion of the fifth conductive layer being located closer to the second side than to the first side,
- another one of the negative electrode ends is connected to one end portion of the sixth conductive layer, the one end portion of the sixth conductive layer being located closer to the second side than to the first side, and
- the two negative electrode ends are disposed between the two positive electrode ends.

5. The semiconductor module according to claim 4, wherein the first semiconductor element and the second semiconductor element are disposed closer to the first side than to the second side, and the third semiconductor element and the fourth semiconductor element are disposed closer to the second side than to the first side.

6. The semiconductor module according to claim 4, further comprising:
- a first wire connecting the upper-surface electrode of the first semiconductor element and the third conductive layer;
- a second wire connecting the upper-surface electrode of the second semiconductor element and the fourth conductive layer;
- a third wire connecting the upper-surface electrode of the third semiconductor element and the fifth conductive layer; and
- a fourth wire connecting the upper-surface electrode of the fourth semiconductor element and the sixth conductive layer, wherein
- the first wire, the second wire, the third wire, and the fourth wire each extend in the second direction.

7. The semiconductor module according to claim 4, wherein the first to fourth semiconductor elements are each disposed in plurality aligned in the first direction.

8. The semiconductor module according to claim 4, wherein
- the first semiconductor element, the third semiconductor element, the first conductive layer, the third conductive layer and the fifth conductive layer are included in one set,
- the second semiconductor element, the fourth semiconductor element, the second conductive layer, the fourth conductive layer and the sixth conductive layer are included in an other set, and
- the first and third semiconductor elements, the first, third and the fifth conductive layers in the one set, and the second and fourth semiconductor elements, the second, fourth and sixth conductive layers in the other set are respectively disposed in a mirror image arrangement.

* * * * *